(12) United States Patent
von Malm

(10) Patent No.: US 10,236,416 B2
(45) Date of Patent: Mar. 19, 2019

(54) DEVICE AND METHOD FOR PRODUCING A DEVICE

(71) Applicant: OSRAM Opto Semiconductors GmbH, Regensburg (DE)

(72) Inventor: Norwin von Malm, Nittendorf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 29 days.

(21) Appl. No.: 15/565,106

(22) PCT Filed: Apr. 7, 2016

(86) PCT No.: PCT/EP2016/057637
§ 371 (c)(1),
(2) Date: Oct. 6, 2017

(87) PCT Pub. No.: WO2016/162430
PCT Pub. Date: Oct. 13, 2016

(65) Prior Publication Data
US 2018/0122990 A1    May 3, 2018

(30) Foreign Application Priority Data
Apr. 10, 2015    (DE) .................... 10 2015 105 509

(51) Int. Cl.
*H01L 33/00*    (2010.01)
*H01L 33/38*    (2010.01)
(Continued)

(52) U.S. Cl.
CPC .......... *H01L 33/38* (2013.01); *H01L 31/0203* (2013.01); *H01L 31/02005* (2013.01);
(Continued)

(58) Field of Classification Search
CPC ............. H01L 27/144; H01L 31/02005; H01L 31/0203; H01L 31/022408; H01L 31/0236;
(Continued)

(56) References Cited

U.S. PATENT DOCUMENTS 8,110,421 B2    2/2012    Sugizaki et al.
8,742,448 B2    6/2014    Ramchen et al.
(Continued)

FOREIGN PATENT DOCUMENTS

DE    102007046743 A1    4/2009
DE    102008024704 A1    10/2009
(Continued)

*Primary Examiner* — Brook Kebede
(74) *Attorney, Agent, or Firm* — Slater Matsil, LLP

(57) ABSTRACT

A device and a method for producing a device are disclosed. In an embodiment the device includes a carrier and a semiconductor body arranged in a vertical direction on the carrier. The carrier includes at least one metal layer for electrically contacting the semiconductor body, a non-metallic molding layer, at least one electrically insulating insulation layer, wherein the insulation layer is arranged in the vertical direction between the semiconductor body and the molding layer and internal anchoring structures, wherein at least two layers of the metal layer, the molding layer and the insulation layer are anchored to one another by the internal anchoring structures.

20 Claims, 5 Drawing Sheets

(51) Int. Cl.
*H01L 33/62* (2010.01)
*H01L 31/02* (2006.01)
*H01L 31/0203* (2014.01)
*H01L 31/0224* (2006.01)
*H01L 33/54* (2010.01)

(52) U.S. Cl.
CPC ...... *H01L 31/022408* (2013.01); *H01L 33/54* (2013.01); *H01L 33/62* (2013.01)

(58) Field of Classification Search
CPC ....... H01L 31/18; H01L 33/025; H01L 33/38; H01L 33/54; H01L 33/382; H01L 33/62
USPC .................................................. 257/97–100
See application file for complete search history.

(56) References Cited

U.S. PATENT DOCUMENTS

| | | | |
|---|---|---|---|
| 9,263,655 B2 | 2/2016 | Hoeppel | |
| 9,698,282 B2 | 7/2017 | Jaeger et al. | |
| 9,721,940 B2 | 8/2017 | Plossl et al. | |
| 2012/0086026 A1* | 4/2012 | Engl | H01L 27/156 257/93 |
| 2012/0322186 A1* | 12/2012 | Rode | H01L 33/22 438/29 |
| 2013/0187192 A1* | 7/2013 | Hoeppel | H01L 31/02005 257/99 |
| 2015/0021628 A1 | 1/2015 | Medendorp, Jr. et al. | |
| 2015/0255685 A1 | 9/2015 | Herrmann et al. | |

FOREIGN PATENT DOCUMENTS

| | | |
|---|---|---|
| DE | 102009015963 A1 | 10/2010 |
| DE | 102010025320 A1 | 12/2011 |
| DE | 102012217533 A1 | 3/2014 |
| DE | 102013110853 A1 | 4/2015 |
| DE | 102014116935 A1 | 5/2016 |
| DE | 102015100578 A1 | 7/2016 |
| EP | 2846367 A1 | 3/2015 |
| WO | 2013084144 A1 | 6/2013 |

* cited by examiner

DEVICE AND METHOD FOR PRODUCING A DEVICE

This patent application is a national phase filing under section 371 of PCT/EP2016/057637, filed Apr. 7, 2016, which claims the priority of German patent application 10 2015 105 509.0, filed Apr. 10, 2015, each of which is incorporated herein by reference in its entirety.

TECHNICAL FIELD

A device and a method for producing a device are provided.

BACKGROUND

A conventional device which includes a multilayer carrier may exhibit inadequate mechanical stability due to poor adhesion between the layers of the carrier.

SUMMARY OF THE INVENTION

Embodiments provide a device with high mechanical stability. Furthermore, embodiments provide a simplified method for producing a device.

According to at least one embodiment of a device, the latter comprises a carrier and a semiconductor body arranged on the carrier. The carrier may comprise a plurality of layers of different materials. For example, the carrier comprises at least one metal layer, a molding layer and at least one electrically insulating insulation layer.

The metal layer is configured in particular for electrical contacting of the semiconductor body via the carrier. The metal layer may be of continuous configuration or comprise a plurality of spaced sub-regions. The insulation layer is configured for electrical insulation between electrically conductive sub-regions or sub-layers of the carrier, wherein the sub-regions or sub-layers are assigned in particular to different electrical polarities of the device.

The molding layer in particular forms a mold body of the carrier. For example, the molding layer surrounds at least one part of the metal layer and/or of the insulation layer on all sides. The metal layer and/or the insulation layer may thus be embedded at least in places in the molding layer. The molding layer is, for example, of continuous configuration. The molding layer is, for example, formed of an electrically insulating material, for instance of a plastics material or potting material. The molding layer and/or the insulation layer may be filled with inorganic or organic particles, for instance with scattering particles. The carrier may comprise a plurality of metal layers and/or a plurality of insulation layers.

According to at least one embodiment of the device, anchoring structures are formed in the carrier. The internal anchoring structures may be formed by indentations, for instance in the form of recesses, or by protrusions, for instance in the form of projections, of the metal layer or metal layers, the molding layer and/or the insulation layer or the insulation layers. By means of the anchoring structures, at least two in particular mutually adjacent layers from the group consisting of the metal layer, the molding layer and the insulation layer may be anchored together.

When anchoring two mutually adjacent layers, material of a first layer, which, for example, forms an anchoring structure of the first layer, may engage in an anchoring structure of a second layer, such that the first and second layers are anchored together by means of the anchoring structures. The anchoring structures of the first and second layers are preferably conformed to one another with regard to their geometry, such that the first and second layers in particular form a form-locked connection. The anchored-together layers in this case adjoin one another directly in particular at least at locations of the anchoring structures. The above-mentioned first and second layers may respectively be the metal layer or molding layer or insulation layer. Manufacturing-related roughnesses on side faces, which arise within the bounds of manufacturing tolerances during a method step, in particular during a laser dicing process or an etching process, and contribute negligibly to anchoring, do not count as part of the anchoring structure for the purposes of the present application.

According to at least one embodiment of the device, different layers of the carrier are anchored together in particular at least with regard to a vertical direction. A vertical direction is understood to mean a direction which is perpendicular to a main area of extension of the semiconductor body. In particular, the vertical direction is parallel to a growth direction of the semiconductor layers of the semiconductor body. A lateral direction is understood to be a direction which extends parallel to a main area of extension of the semiconductor body. The vertical direction and the lateral direction are thus orthogonal to one another. Two layers are anchored together with regard to the vertical direction by means of the anchoring structures if the anchoring structures prevent the two layers from moving away from one another or becoming detached from one another in the vertical direction in particular on external application of force.

In at least one embodiment of the device, the latter comprises a carrier and a semiconductor body arranged in the vertical direction on the carrier. The carrier contains at least one metal layer for electrical contacting of the semiconductor body, a non-metallic molding layer and at least one electrically insulating insulation layer. The device comprises internal anchoring structures which are formed in the carrier. The internal anchoring structures anchor together at least two layers from the group comprising the metal layer, the molding layer and the insulation layer, for example, at least with regard to the vertical direction.

As a result of the internal anchoring structures, a material of one layer of the carrier may engage in the anchoring structures of another layer of the carrier, so increasing mechanical adhesion between the layers of the carrier. As a result of the anchoring structures, an interface between two adjacent layers of the carrier may be enlarged, whereby adhesion between the adjacent layers is improved overall. The anchoring structure may in this respect in particular have a branched shape at one end. The internal anchoring structures may take the form of three-dimensional, interpenetrating structures, for instance barbs, whereby adhesion is increased at the interfaces, for instance at a metal-insulation, mold body-insulation or mold body-metal interface, and detachment of the different layers of the carrier at the interfaces is completely or virtually completely ruled out. This significantly increases the mechanical and thermo-mechanical stability of the carrier. The anchoring at least in the vertical direction may prevent different layers of the carrier from detaching from one another, for example, due to the influence of heat or external force on the layers or over the course of time for instance due to decreasing adhesive strength between the layers.

According to at least one embodiment of the device, the at least two layers from the group comprising the metal layer, the molding layer and the insulation layer are conformed to one another with regard to their local geometry at locations of the internal anchoring structures, such that the at least two layers thereby form a form-locked connection at least in places. The anchoring structures may in this respect each have a cross-section which varies, for example, in the vertical direction or the lateral direction.

The internal anchoring structures are preferably projections from or recesses in the metal layer, the molding layer and/or the insulation layer, wherein the carrier is configured such that the projections of one layer may penetrate the recesses of the other layer of the carrier. The anchoring structures may in this respect each comprise more than two, for instance at least three or at least four prongs extending in different directions. Such an anchoring structure, for example, has an enlarged cross-section at one of its ends. Detachment of two mutually adjacent, anchored-together layers of the carrier with one internal anchoring structure for instance in the form of a projection and a further internal anchoring structure for instance in the form of a recess, wherein both the projection and the recess have an enlarged cross-section at one end, may be virtually completely ruled out due to the mating of the anchoring structures of the anchored-together layers.

According to at least one embodiment of the device, the insulation layer is arranged in the vertical direction between the semiconductor body and the molding layer. The insulation layer may in this case be anchored to the molding layer by means of the internal anchoring structures. The carrier may in this case comprise two different metal layers, wherein the insulation layer may serve at least in places as electrical insulation between the two metal layers of the carrier.

According to at least one embodiment of the device, the metal layer is a connection layer having a first sub-region and a second sub-region spaced laterally from the first sub-region by an interspace. The first sub-region of the metal layer may be assigned to a first electrical polarity and the second sub-region of the metal layer to a second electrical polarity of the device different from the first electrical polarity. In particular, the connection layer is anchored to the molding layer by means of the internal anchoring structures. The internal anchoring structures may, for example, be formed in the interspace. The molding layer is preferably electrically insulating and may partially or completely fill the interspace between the sub-regions of the connection layer. The molding layer, for example, surrounds the connection layer on all sides and forms a mold body of the carrier. The molding layer may be anchored both to the connection layer and to the insulation layer for instance by different anchoring structures.

According to at least one embodiment of the device, the semiconductor body comprises a first semiconductor layer on a side remote from the carrier, a second semiconductor layer on a side facing the carrier and an active layer arranged between the first and second semiconductor layers. The active layer may be configured to generate electromagnetic radiation for instance when the device is in operation. The device, for example, comprises a through-via, which is formed at least in part in the semiconductor body. The through-via is configured in particular for electrical contacting of the first semiconductor layer and may extend from the carrier through the second semiconductor layer and the active layer into the first semiconductor layer.

The first sub-region of the connection layer, for example, is electrically connected to the first semiconductor layer by way of the through-via. The second sub-region may here be electrically connected to the second semiconductor layer.

Through the electrical contacting of the semiconductor body by way of the first and second sub-regions of the connection layer, the device may be externally electrically contacted at the back, i.e., by way of a backface of the carrier remote from the semiconductor body, and thus for instance take the form of a surface-mountable device. The device may comprise a plurality of through-vias to achieve uniform current distribution.

According to at least one embodiment of the device, the carrier comprises a further metal layer in addition to the connection layer, said further metal layer taking the form, for example, of a device stabilizing layer. The stabilizing layer is preferably arranged between the semiconductor body and the connection layer. The stabilizing layer preferably laterally completely bridges the interspace between the sub-regions of the connection layer.

Complete lateral bridging of the interspace means that the first sub-region and the second sub-region are bridged fully by the stabilizing layer at least in a lateral direction at locations of the interspace. In particular, in plan view the stabilizing layer covers at least 60%, for instance at least 80% or at least 90% of the entire interspace. Complete lateral bridging or covering of the interspace by the stabilizing layer has a mechanically stabilizing effect on the device, such that possible mechanical weak points are largely or completely prevented in particular at locations of the interspace. The stabilizing layer in this case conveniently takes the form of a self-supporting layer of the device. For example, the stabilizing layer contains a metal or consists of a metal. The stabilizing layer preferably has a vertical thickness for instance of between 5 µm and 50 µm inclusive or between 10 µm and 50 µm inclusive. The stabilizing layer may be of continuous configuration.

The stabilizing layer is configured, together with the connection layer, in particular for electrical contacting of the semiconductor body. The first semiconductor layer is externally electrically contactable, for example, by way of the through-via, the stabilizing layer and the first sub-region of the connection layer. The stabilizing layer may in this case be in direct electrical contact with the through-via or with the first sub-region and thus be assigned to the first electrical polarity of the device. In this case, the stabilizing layer is in particular electrically insulated from the second sub-region of the connection layer by the electrically insulating insulation layer of the carrier. Alternatively, the second semiconductor layer of the semiconductor body may be electrically connected to the second sub-region of the connection layer by way of the stabilizing layer. In this case, the stabilizing layer is assigned to the second electrical polarity of the device and is in particular electrically insulated from the second sub-region of the connection layer and from the through-via by the insulation layer or the insulation layers of the carrier.

According to at least one embodiment of the device, the carrier comprises at least two metal layers, wherein one of the at least two metal layers is the stabilizing layer arranged in the vertical direction between the semiconductor body and the molding layer. The further metal layer may be the connection layer or a mirror layer. The stabilizing layer comprises internal anchoring structures of the carrier and is in particular anchored to the insulation layer, which likewise comprises anchoring structures. The insulation layer may in this case be arranged in the vertical direction between the stabilizing layer and the molding layer. The insulation layer is preferably anchored both to the stabilizing layer and to the molding layer by different internal anchoring structures, so achieving particularly high mechanical stability for the carrier.

According to at least one embodiment of the device, the carrier comprises at least two metal layers, wherein one of the at least two metal layers is an electrically conductive mirror layer arranged in the vertical direction between the semiconductor body and the molding layer. The mirror layer comprises internal anchoring structures and is in particular anchored to the insulation layer. A further metal layer of the at least two metal layers may be the connection layer, wherein the mirror layer is arranged between the connection layer and the semiconductor body. The semiconductor body may in this case comprise a surface remote from the carrier which serves as a radiation passage face, for instance as a radiation exit face of the device. Electromagnetic radiation which exits laterally or rearwards of the carrier may be reflected at the mirror layer and thus reflected back again in the direction of the radiation exit face of the device, so increasing the efficiency of the device. The mirror layer may in this case be electrically conductive, wherein the mirror layer may for instance be in direct electrical contact with the through-via and/or with the first sub-region of the connection layer for electrical contacting of the first semiconductor layer.

According to at least one embodiment of the device, the carrier comprises three metal layers. The device may additionally comprise two insulation layers and one molding layer. The three metal layers may be the stabilizing layer, the mirror layer and the connection layer. The two insulation layers may be a passivation layer arranged between the semiconductor body and the mirror layer and an intermediate insulation layer arranged between the stabilizing layer and the connection layer. The metal layers and insulation layers and the molding layer may each comprise internal carrier anchoring structures. The internal anchoring structures may anchor the sub-regions of the connection layer to the molding layer with regard to the lateral and/or vertical direction. In this case, the insulation layers may be anchored to the metal layers and/or to the molding layer with regard to the lateral and/or vertical direction.

According to at least one embodiment of the device, the carrier comprises at least one or a plurality of protective elements. The protective element or the plurality of protective elements is in particular configured so as to act as protection against possible electrostatic discharges (ESD). The protective element takes the form of a safety fuse, for example. In particular, the protective element is a Schottky diode or a thyristor. The protective element or the plurality of protective elements may be arranged between the first sub-region and the second sub-region of the connection layer. The protective element and/or the plurality of protective elements may in particular be produced by means of a 3D printing method for instance during formation of the sub-regions of the connection layer.

In one embodiment of a method for producing a device having a carrier and a semiconductor body arranged in the vertical direction on the carrier, the semiconductor body is provided. The semiconductor body may comprise a plurality of semiconductor layers, which are, for example, grown in layers on a growth substrate. In a subsequent method step, the growth substrate may be partially or completely removed from the semiconductor body, such that in the finished state the device is in particular free of a growth substrate.

The carrier comprises a plurality of layers which may be formed, for example, in succession or at least in part simultaneously, i.e., in one and the same method step. The carrier, for example, comprises at least one metal layer for electrically contacting the semiconductor body, a non-metallic molding layer and at least one electrically insulating insulation layer, wherein internal anchoring structures are formed in the carrier for instance on formation of the layers of the carrier, such that at least two layers from the group comprising the metal layer, the molding layer and the insulation layer are anchored to one another by means of the internal anchoring structures in particular at least with regard to the vertical direction.

The carrier is in particular produced on the semiconductor body. The carrier is in particular applied in layers to the semiconductor body. That is to say, the device is for instance free of a premanufactured carrier, for example, produced separately from the semiconductor body. In particular, the device is free of a bonding layer, for instance of a solder layer or an adhesive layer, which is arranged between the semiconductor body and the carrier. The semiconductor body and the carrier thus in particular form an integral unit without the assistance of a bonding layer arranged between the semiconductor body and the carrier.

According to at least one embodiment of the method, the carrier having the internal anchoring structures is produced at least in part by means of a 3D printing method. In particular, the anchoring structures, which may be recesses or projections of the metal layer, the insulation layer or the molding layer, are produced by means of the 3D printing method. In this case, materials of different layers of the carrier, in particular the metal layer, the molding layer and the insulation layer, are applied for instance using the inkjet printing principle in successive layers and preferably laterally next to one another. In between, depending on the material used, the printed layers of the carrier may be cured, chemically crosslinked, for instance thermally or optically induced, or sintered, for example, by means of a laser, such that said layers are hardened.

According to at least one embodiment of the method, different materials are applied laterally next to one another to produce the carrier with the internal anchoring structures, wherein, to produce the metal layer, metallic powders in the form of micro- or nanoparticles are for instance printed by means of a 3D printing method. The metallic powders, which, for example, contain at least one of the materials nickel, gold, tungsten, silver and copper, may be loose or bound in pastes or inks. To harden the printed layers, local sintering for instance by laser or sintering of the entire device in a kiln may be applied.

According to at least one embodiment of the method, to produce the molding layer and/or the insulation layer polymers or ceramic powders are printed using the 3D printing method. Prior to printing, the polymers may be in molten or dissolved or liquid form. The polymers may be epoxides, silicones, acrylates, polyethanes, polyterephthalates or polysilazanes. It is also possible for the polymers to be filled with inorganic particles, for instance with scattering particles. For example, the polymers are filled with particles from at least one of the following materials: glass, $TiO_2$, $SiO_2$, ZnO, $ZrO_2$, BN, $Si_3N_4$, $Al_2O_3$ and AlN. The ceramic powders may be present in the form of micro- or nanoparticles, which are, for example, loose or bound in pastes or inks. The ceramic powders, for example, comprise at least one of the materials ZnO, $ZrO_2$, BN, $Si_3N_4$, $Al_2O_3$ and AlN. To produce the insulation layer, moreover, different silicon dioxide formers or silsesquioxanes are particularly suitable in particular for the 3D printing method. The process for hardening the printed layers may proceed by sintering of the entire device in the kiln or by local laser sintering or by UV irradiation.

According to at least one embodiment of the method, the metal layer takes the form of a connection layer of the carrier having a first sub-region and a second sub-region spaced laterally from the first sub-region by an interspace, wherein the connection layer comprises internal carrier anchoring structures which are produced by means of a 3D printing method. The molding layer may be formed by a non-metallic material, for instance a molding compound or potting compound, wherein the molding layer in particular adjoins the connection layer, and for instance follows a contour of the connection layer, such that the molding layer is anchored to the connection layer by means of the anchoring structures. The interspace may be filled with the molding layer. The molding layer may here likewise be produced by a 3D printing method, for example, in the same method step as the metal layer or metal layers.

According to at least one embodiment of the method, the molding layer is produced by a molding method. A molding method is generally understood to mean a method with which a molding composition may be configured according to a specified shape and if necessary cured. In particular, the term "molding method" encompasses molding, film assisted molding, injection molding, transfer molding and compression molding.

According to at least one embodiment of the method, the metal layer having the anchoring structures is produced by a multistage method, for instance an electroplating method. The metal layer is in particular the connection layer with the sub-regions. The molding layer may be formed by means of a molding or press-molding method, such that the metal layer with the anchoring structures or at least some of the metal layer is surrounded on all sides by the molding layer and the metal layer is anchored to the molding layer by means of the anchoring structures. The metal layer is thus at least partly surrounded by the molding layer.

According to at least one embodiment of the method, a plurality of devices is produced, wherein the devices initially comprise a common carrier and a common semiconductor body, and the devices are singulated in a method step, such that the devices each comprise a multilayer carrier as described above and a semiconductor body arranged on this carrier, wherein the multilayer carrier and the semiconductor body arranged thereon of the singulated devices arise from the common semiconductor body and the common carrier.

The method is particularly suitable for producing an above-described device. Features described in connection with the device may therefore also be used for the method and vice versa.

BRIEF DESCRIPTION OF THE DRAWINGS

Further advantages, preferred embodiments and further developments of the device and of the method are revealed by the exemplary embodiments explained below with reference to FIGS. 1 to 9, in which.

Figure 1:
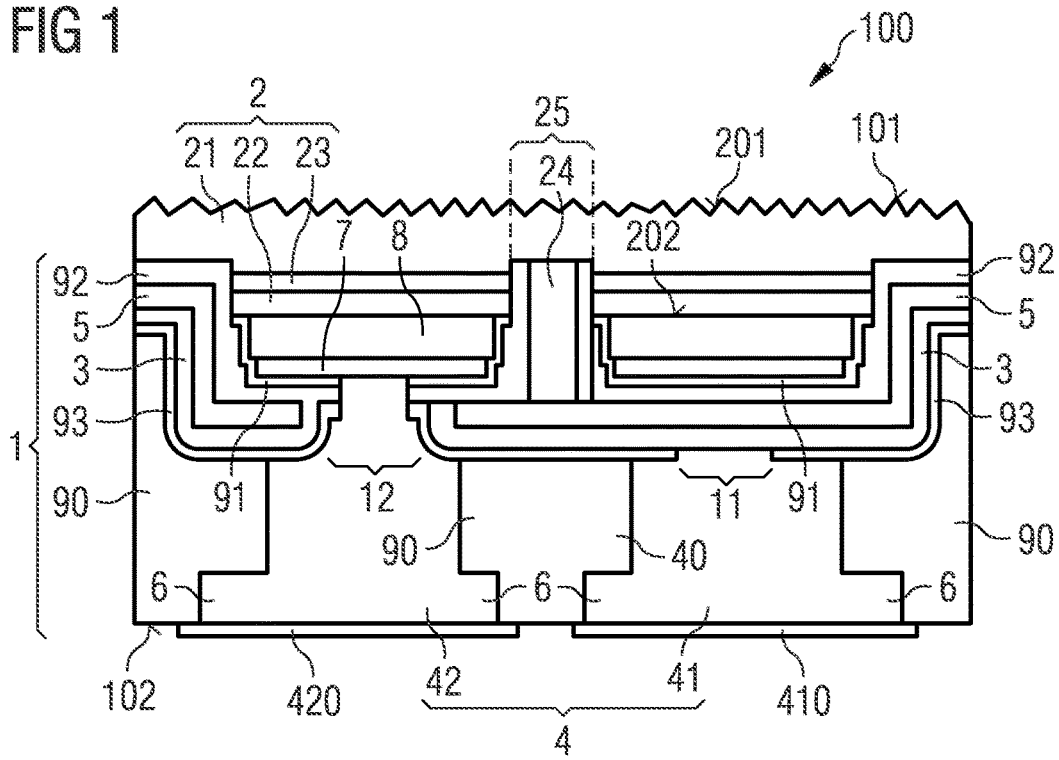
FIG. 1 is a schematic sectional view of one exemplary embodiment of a device.

Identical, similar or identically acting elements are provided with identical reference numerals in the figures. The figures are in each case schematic representations and therefore are not necessarily true to scale. Rather, comparatively small elements and in particular layer thicknesses may be illustrated on an exaggeratedly large scale for clarification.

DETAILED DESCRIPTION OF ILLUSTRATIVE EMBODIMENTS

A first exemplary embodiment of a device is illustrated schematically in FIG. 1. The device 100 comprises a carrier 1 and a semiconductor body 2 arranged on the carrier. The semiconductor body 2 comprises a first semiconductor layer 21, a second semiconductor layer 22 and an active layer 23 arranged between the first and the second semiconductor layer.

In particular, the semiconductor body comprises or consists of a III-V or a II-VI compound semiconductor material. The first semiconductor layer 21 and the second semiconductor layer 22 may, for example, be n-conductive and p-conductive respectively, or vice versa. The second semiconductor layer 22 is, for example, p-conductive. The first semiconductor layer 21, the second semiconductor layer 22 and the active layer 23 may each comprise one or a plurality of doped or undoped layers. The active layer 23 is in particular a p-n junction zone of the semiconductor body. In particular, when the device 100 is in operation, the active layer 23 emits or detects electromagnetic radiation in the visible, ultraviolet or infrared region of the spectrum.

In particular, the device 100 is an optoelectronic semiconductor chip. The carrier 1 thus forms a carrier of the semiconductor chip. The semiconductor body 2 of the semiconductor chip for instance directly adjoins the carrier 1. The semiconductor chip in particular consists of the carrier 1 and the semiconductor body 2.

The device 100 comprises a radiation passage face 101 and a backface remote from the radiation passage face. In particular, the backface 102 of the device is a backface 102 of the carrier 1. The radiation passage face 101 is of patterned configuration. In particular, the radiation passage face 101 is formed by a first major face 201 of the semiconductor body 2, for instance by a surface of the first semiconductor layer 21. The semiconductor body 2 comprises a second major face 202 facing the carrier 1, which second major face is formed for instance by a surface of the second semiconductor layer 22. It is also possible for the radiation passage face 101 to be formed by a surface of a radiation-transmissive layer arranged on the first semiconductor layer 21. The device 100 is preferably externally electrically contactable via the backface 102. The device 100 may thus take the form of a surface-mountable device.

In FIG. 1 the carrier 1 comprises a molding layer 90, a plurality of insulation layers, namely a first insulation layer 91, a passivation layer 92 and an intermediate insulation layer 93, and a plurality of metal layers, namely a stabilizing layer 3, a connection layer 4 and a mirror layer 5. Furthermore, the carrier comprises a diffusion barrier layer 7 and a contact layer 8 between the semiconductor body 2 and the connection layer 4. The first insulation layer 91 may take the form of a sublayer of the passivation layer 92. The first insulation layer 91 and the passivation layer 92 may be formed in part in a common method step or in separate method steps. The diffusion barrier layer 7 may prevent metal atoms or metal ions migrating from the connection layer 4 or from the mirror layer 5 into the contact layer 8 and into the semiconductor body 2 and thus into the active layer 23 and causing damage thereto.

The semiconductor body 2 comprises a recess 25. The recess 25 extends from the carrier 1 through the second semiconductor layer 22 and the active layer 23 into the first semiconductor layer 21. A through-via 24 is formed in the recess 25. The through-via 24 is in this case surrounded laterally in particular all round by the passivation layer 92.

The through-via 24 is electrically conductive and, for example, comprises a metal. The through-via 24 and the mirror layer 5 may comprise the same electrically conductive material. For example, the mirror layer 5 comprises a metal, for instance aluminum, rhodium, palladium, silver or gold. In particular, the mirror layer 5 reflects at least 60%, preferably at least 80%, particularly preferably at least 90% of a fraction impinging thereon of the spectrum of the radiation generated by the active layer 23 when the device is in operation.

The through-via 24 is in particular in direct electrical contact with the mirror layer 5. The through-via 24 is electrically connected with the first sub-region 41 of the connection layer 4 by way of the mirror layer 5 and the stabilizing layer 3. The through-via 24 indirectly or directly adjoins the first semiconductor layer 21 and is surrounded laterally in particular all round by the semiconductor body 2. It is also possible for the device to comprise a plurality of recesses 25 and through-vias 24 for electrical contacting of the first semiconductor layer 21, whereby particularly uniform current distribution is achieved within the first semiconductor layer 21.

The connection layer 4 contains a first sub-region 41 and a second sub-region 42 spaced laterally from the first sub-region, wherein an interspace 40 is formed for electrical insulation between the first sub-region 41 and the second sub-region 42. The interspace 40 is here filled by the molding layer 90, which, for example, comprises a non-metallic material. The first sub-region 41 is assigned to a first electrical polarity of the device. The second sub-region 42 is assigned to a second electrical polarity of the device which is different from the first electrical polarity. The semiconductor body 2 and thus the device 100 may be externally electrically contactable by way of the first sub-region 41 and the second sub-region 42 of the connection layer 4.

In FIG. 1 the first semiconductor layer 21 is electrically connected to the first sub-region 41 via the through-via 24, the mirror layer 5 and the stabilizing layer 3. The second semiconductor layer 22 is electrically connected via the contact layer 8 to the second sub-region 42 of the connection layer 4. The carrier 1 comprises on its backface 102 a first bonding layer 410 in electrical contact with the first sub-region 41 and a second bonding layer 420 in electrical contact with the second sub-region 42. The device 100 is externally electrically contactable by way of the bonding layers 410 and 420.

In FIG. 1 the stabilizing layer 3 is arranged between the semiconductor body 2 and the connection layer 4. In plan view onto the connection layer the interspace 40 is fully bridged laterally by the stabilizing layer 3. In other words, the interspace 40 is thus completely covered by the stabilizing layer 3 at least in a lateral direction. In particular, the stabilizing layer 3 may completely cover the interspace 40 when viewed in plan view. Due to the stabilizing layer 3 laterally bridging or covering the interspace 40, no region of the active layer 23 or of the semiconductor body 2 is left in particular in the region of the interspace 40 without mechanical support by a mechanically stabilizing metal layer, namely by the stabilizing layer 3 or by the connection layer 4, such that the device 100 is particularly mechanically stable.

The stabilizing layer 3 has a vertical thickness which amounts preferably to at least 5 μm, for instance between 5 μm and 50 μm inclusive, for example, between 5 μm and 30 μm inclusive or between 10 μm and 30 μm inclusive. The connection layer 4 has a vertical thickness which is for instance at least the same size as, preferably at least 2 times, for instance at least 4 or 10 times the vertical thickness of the stabilizing layer 3.

The stabilizing layer 3 and the connection layer 4 preferably overlap in plan view, such that the stabilizing layer 3 and the connection layer 4 in particular cover at least 80%, for instance at least 90% of the total area of the active layer 23 or of the semiconductor body 2. In particular, the stabilizing layer 3 and the connection layer 4 may together completely cover the active layer 23 when viewed in plan view. There is thus in particular no or barely a region of the active layer 23 or of the semiconductor body 2 left without mechanical support by the mechanically stabilizing metal layers 3 and 4, such that the device 100 is particularly mechanically stable. The stabilizing layer 3 may here be of continuous configuration.

In FIG. 1 the mirror layer 5 is arranged between the passivation layer 92 and the stabilizing layer 3. Electromagnetic radiation, which exits from the semiconductor body 2 at the second major face 202 of the semiconductor body 2, may be reflected back at the mirror layer 5 to the radiation passage face 101 of the device. The passivation layer 92 and/or the molding layer 90 may comprise scattering particles such as titanium oxide or silicon oxide, whereby the electromagnetic radiation entering the passivation layer 92 or the molding layer 90 may likewise be reflected back to the radiation passage face 101. The passivation layer 92 and/or the molding layer 90 may each be filled with organic or inorganic particles for instance of at least one of the materials $TiO_2$, $SiO_2$, ZnO, $ZrO_2$, BN, $Si_3N_4$, $Al_2O_3$ and AlN. The organic and/or inorganic particles may also serve to adapt the coefficient of thermal expansion to the semiconductor and/or metal layers.

The intermediate insulation layer 93 is arranged between the stabilizing layer 3 and the connection layer 4. The intermediate insulation layer 93 comprises an opening 11, through which the first sub-region 41 of the connection layer 4 extends to the stabilizing layer 3. The intermediate insulation layer 93 comprises a further opening 12, through which the second sub-region 42 of the connection layer 4 extends to the contact layer 8. The intermediate insulation layer 93 serves as electrical insulation between the stabilizing layer 3 and the second sub-region 42 of the connection layer 4. The intermediate insulation layer 93 may be filled with particles of at least one of the materials $TiO_2$, $SiO_2$, ZnO, $ZrO_2$, BN, $Si_3N_4$, $Al_2O_3$ and AlN.

The connection layer 4 having the first sub-region 41 and the second sub-region 42 is delimited in the lateral direction by the molding layer 90. In particular, the first sub-region 41 and the second sub-region 42 each adjoin the molding layer 90 laterally on all sides. The molding layer 90 in this way forms a mold body of the carrier 1, wherein the molding layer 90 may be in one piece, i.e., continuous. The laterally spaced sub-regions 41 and 42 of the connection layer 4 may thus be held together by the molding layer 90, so forming a stable carrier 1 for the device 100. In FIG. 1 parts of the passivation layer 92, the mirror layer 5, the stabilizing layer 3 and the intermediate insulation layer 93 are surrounded on all sides by the molding layer 90.

The carrier 1 comprises internal anchoring structures 6, which are formed in the carrier 1. In FIG. 1 the internal structures 6 are lateral projections of the connection layer 4. Both the first sub-region 41 and the second sub-region 42 comprise such projections. The sub-regions 41 and 42 each comprise a vertical side face, wherein the anchoring structures 6 each form steps in the side faces in the form of projections. The projections and/or recesses may arise on just one side face, on two opposing side faces or indeed on all sides. The molding layer 90 is molded onto the connection layer 4 with the internal anchoring structures 6, such that the molding layer 90 is anchored in the vertical direction to the connection layer 4. That is to say, displacement of the molding layer 90 in the vertical direction relative to the connection layer 4 is prevented by the anchoring. Detachment of the molding layer 90 from the connection layer 4 or vice versa is thus largely prevented.

In FIG. 1 the internal anchoring structures 6 are parts of the first sub-region 41 and/or of the second sub-region 42 of the connection layer 4, wherein the anchoring structures 6 adjoin the backface 102 of the carrier 1. The first sub-region 41 and the second sub-region 42 thus each have an enlarged lateral cross-section in the immediate vicinity of the backface 102. The first sub-region 41 and/or the second sub-region 42 may comprise a plurality of anchoring structures 6 extending in different lateral directions. Alternatively, the first sub-region 41 and/or the second sub-region 42 of the connection layer 4 may be configured such that the anchoring structures 6 each form a projection extending around laterally on all sides.

Figure 2:
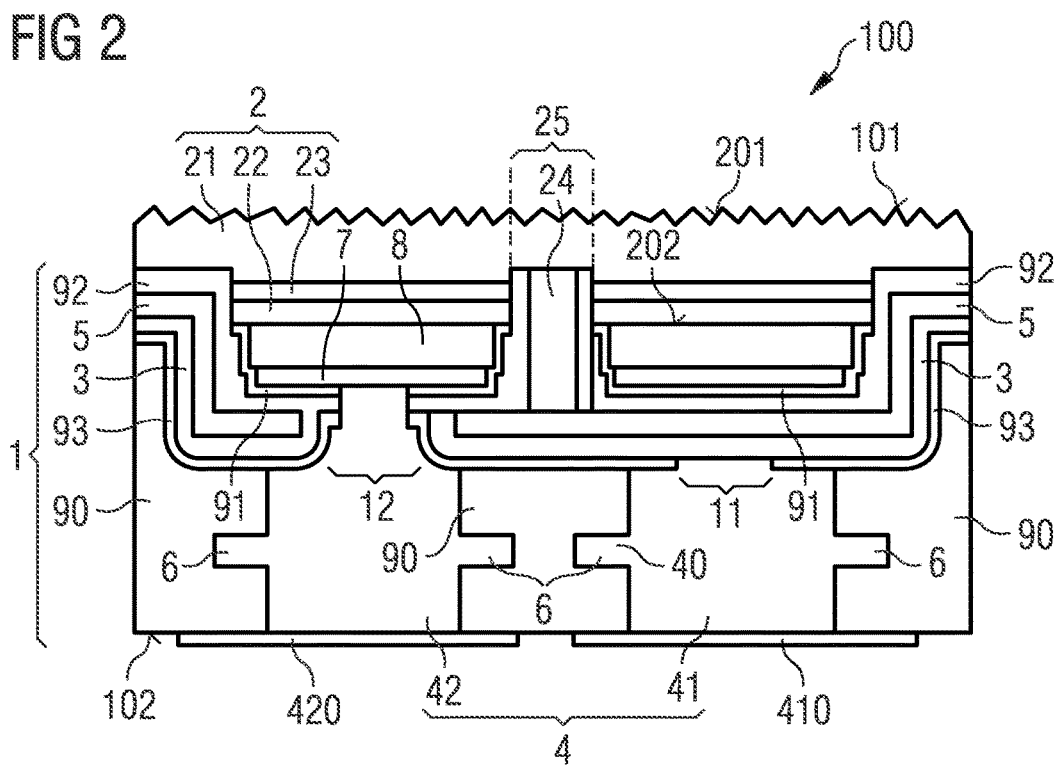
FIGS. 2, 3, 4, 5, 6, 7, 8 and 9 are schematic sectional views of further exemplary embodiments of a device.

A further exemplary embodiment of a device is shown in sectional view in FIG. 2. This exemplary embodiment corresponds substantially to the exemplary embodiment of a device 100 in FIG. 1. In contrast thereto, the anchoring structures 6 of the sub-regions 41 and 42 of the connection layer 4 are vertically spaced from the backface 102. The anchoring structures 6 are also vertically spaced from the intermediate insulation layer 93. The molding layer 90 thus likewise comprises internal anchoring structures 6 at the locations of the projections of the connection layer 4, these taking the form of recesses in the molding layer 90. As in FIG. 1, the anchoring structures 6 of the connection layer 4 extend into the interspace 40. Compared with the device shown in FIG. 1, the device 100 shown in FIG. 2 exhibits increased mechanical stability of the carrier 1 due to the improved anchoring of the sub-regions 41 and 42 of the connection layer 4 to the molding layer 90. Displacement of the sub-regions 41 and 42 relative to the molding layer 90 in the vertical direction may thus be virtually ruled out.

Figure 3:
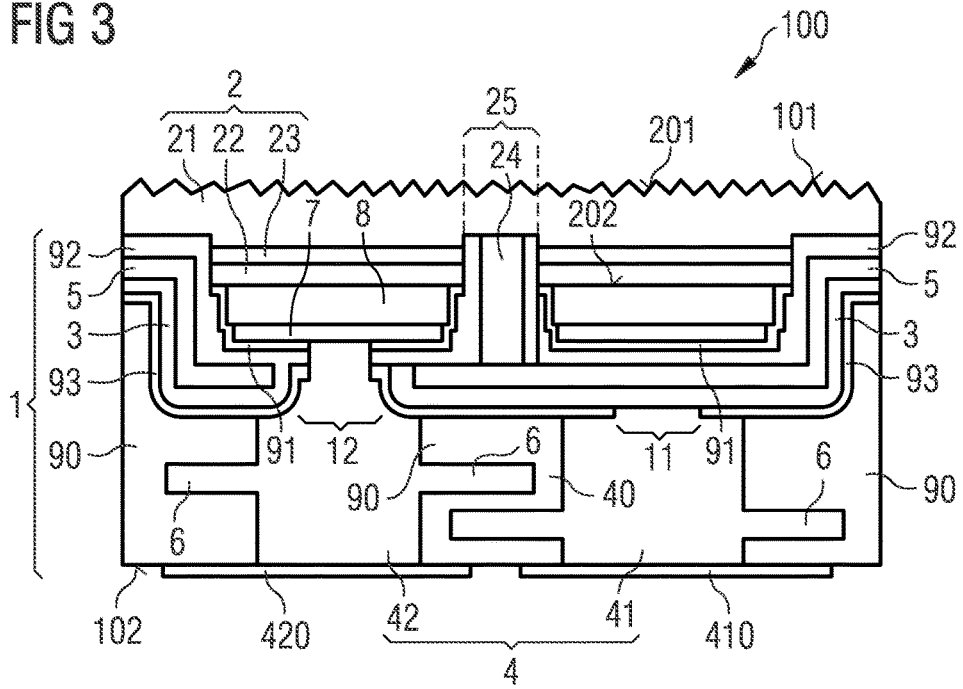

A further exemplary embodiment of a device 100 is shown schematically in sectional view in FIG. 3. This exemplary embodiment corresponds substantially to the exemplary embodiment shown in FIG. 2. In contrast thereto, the anchoring structures 6, here the projections of the connection layer 4, are arranged at different vertical heights. In plan view onto the backface 102, an anchoring structure 6 of the second sub-region 42 overlaps with an anchoring structure 6 of the first sub-region 41 in the region of the interspace 40. The molding layer 90 is formed onto the contour of the connection layer 4 with the anchoring structures 6 and comprises at least two anchoring structures 6 in the form of recesses in the region of the interspace 40, wherein the recesses likewise overlap when viewed in plan view onto the backface 102. Delamination at interfaces of the connection layer 4 and the molding layer 90 may thus in particular be wholly ruled out at least with regard to the vertical direction.

Figure 4:
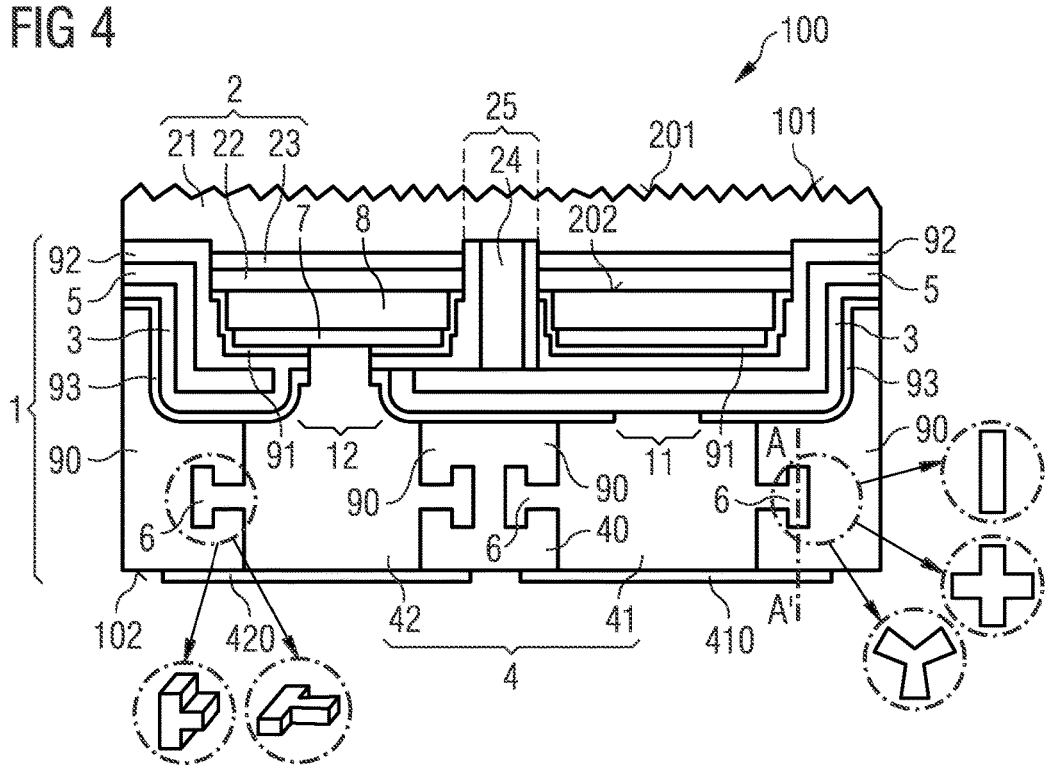

FIG. 4 is a schematic representation of a further exemplary embodiment of a device 100. This exemplary embodiment corresponds substantially to the exemplary embodiment shown in FIG. 2. In contrast thereto, the internal anchoring structures 6 of the carrier 1, which take the form of projections of the connection layer 4 or of recesses of the molding layer 90, each have a vertical cross-section which varies in the lateral direction. In FIG. 4 the anchoring structures 6 each have an enlarged cross-section at one end. The anchoring structures 6 of the connection layer 4 and of the molding layer 90 are conformed with regard to their local geometry, whereby the connection layer 4 and the molding layer 90 form a form-locked connection at the locations of the internal anchoring structures 6.

The anchoring structures 6 in the form of projections or recesses may each have a multi-pronged structure at one end. As shown in FIG. 4, the anchoring structures 6 may each comprise two or more than two, for instance at least three or at least four, prongs extending in different directions. That is to say, the anchoring structures 6 may each have a for instance vertical or lateral cross-section, which extends in particular parallel to a side face of the associated layer with the corresponding anchoring structures, wherein the cross-section may comprise a plurality of, for instance at least two or at least three or at least four, prongs extending in different directions. In FIG. 4, the connection layer 4 and the molding layer 90 are thus anchored together not only with regard to the vertical direction but also with regard to the lateral direction. This enables particularly high mechanical stability of the carrier 1 to be achieved. It is also possible for the anchoring structures 6 to take the form of barbs. The barbs may likewise extend in different lateral and/or vertical directions. The anchoring structure thus has a branched shape.

Figure 5:
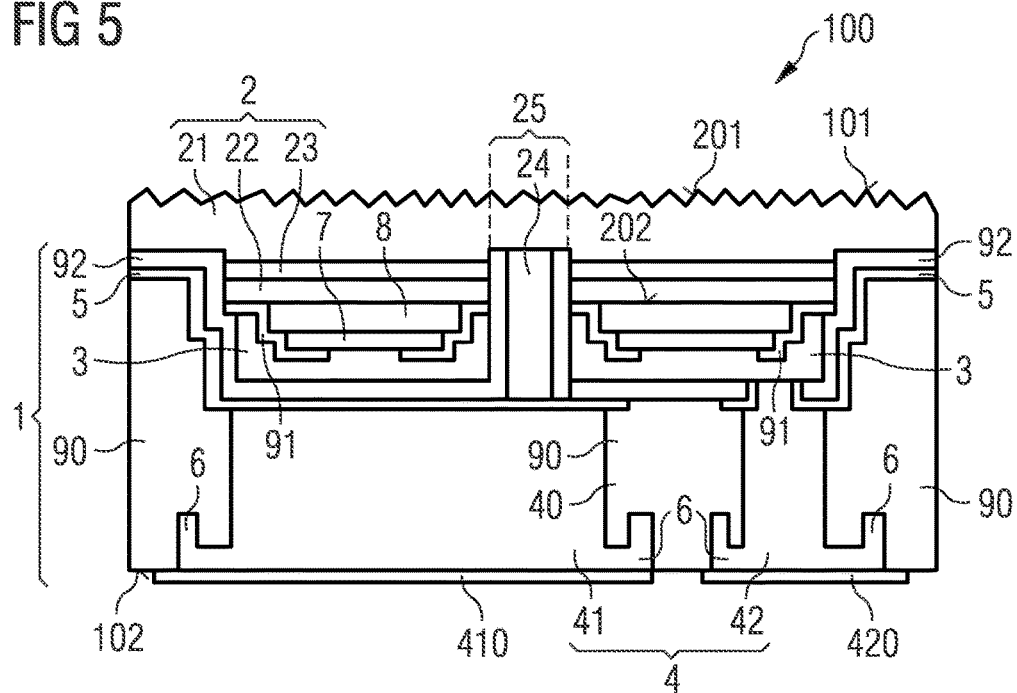

FIG. 5 is a schematic representation of a further exemplary embodiment of a device 100, which corresponds substantially to the exemplary embodiment shown in FIG. 1. In contrast thereto, the anchoring structures 6 of the connection layer 4 or of the molding layer 90 each have an enlarged cross-section at one of their ends, whereby anchoring between the connection layer 4 and the molding layer 90 is achieved both with regard to the lateral direction and with regard to the vertical direction. Furthermore, the first semiconductor layer 21 is electrically connected to the first sub-region 41 of the connection layer 4 by way of the through-via 24 and a sublayer of the mirror layer 5 and not by way of the stabilizing layer 3. The second semiconductor layer 22 is in this case electrically connected with the second sub-region 42 of the connection layer 4 by way of the contact layer 8 and the stabilizing layer 3 and optionally by way of a further sublayer of the mirror layer 5. That is to say, unlike in FIG. 1 the stabilizing layer 3 according to FIG. 5 is configured for electrical contacting of the second semiconductor layer 22 and is thus assigned to the second polarity of the device.

In FIG. 5 the through-via 24 extends through the stabilizing layer 3. For electrical insulation, the passivation layer 92 is arranged in places in the lateral direction between the through-via 24 and the stabilizing layer 3. In FIG. 5 the mirror layer 5 is arranged between the stabilizing layer 3 and the connection layer 4. The passivation layer 92 moreover takes on the role of the intermediate insulation layer 93 shown in FIG. 1, namely electrical insulation of the stabilizing layer 3 from one sub-region of the connection layer 4, in this case from the first sub-region 41, such that it is possible to dispense with the intermediate insulation layer 93, so simplifying the overall structure of the device 100.

Figure 6:
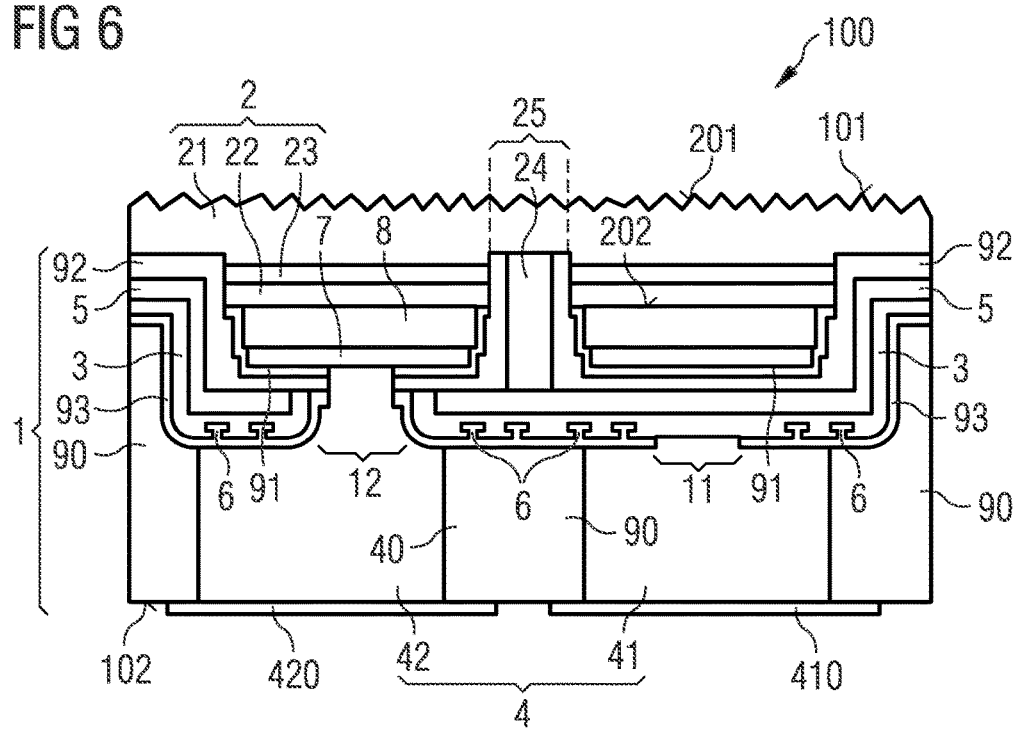

FIG. 6 is a schematic representation of a further exemplary embodiment of a device 100. This exemplary embodiment corresponds substantially to the exemplary embodiment shown in FIG. 1. In contrast thereto, the insulation layer in the form of the intermediate insulation layer 93 and the stabilizing layer 3 each comprise anchoring structures 6, wherein the intermediate insulation layer 93 and the stabilizing layer 3 are anchored together by means of the anchoring structures 6. The anchoring structures 6 in FIG. 6 each have an enlarged cross-section at one of their ends. The anchoring structures 6 may likewise be of multi-pronged configuration, as shown in FIG. 4.

Figure 7:
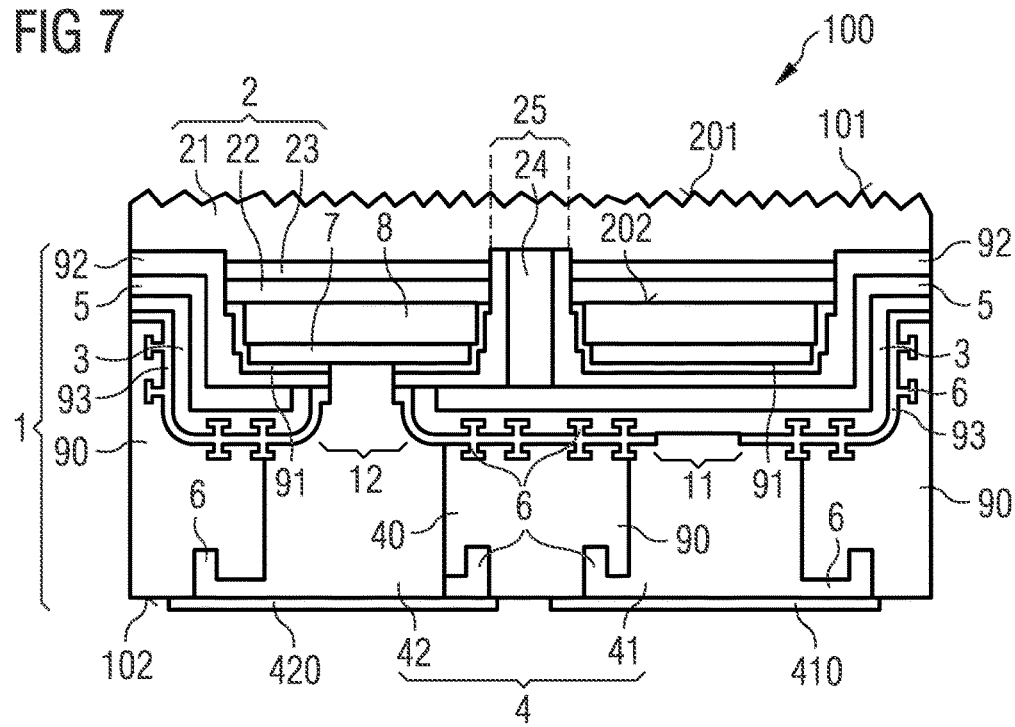

FIG. 7 is a schematic representation of a further exemplary embodiment of a device 100. This exemplary embodiment corresponds substantially to the exemplary embodiment shown in FIG. 6. In contrast thereto, the intermediate insulation layer 93 is anchored to the molding layer 90 by means of the internal anchoring structures 6. The intermediate insulation layer 93 is here arranged between the molding layer 90 and the stabilizing layer 3.

The intermediate insulation layer 93 comprises a plurality of differently oriented anchoring structures 6, wherein the intermediate insulation layer 93 is anchored both to the stabilizing layer 3 and to the molding layer 90 by means of the differently oriented anchoring structures 6. The anchoring structures 6 of the intermediate insulation layer 93 here take the form of projections, wherein the anchoring structures 6 of the molding layer 90 and of the stabilizing layer 3 take the form of recesses. It goes without saying that it is also possible for the anchoring structures 6 of the molding layer 90 and of the stabilizing layer 3 to take the form of projections and the anchoring structures 6 of the intermediate insulation layer 93 the form of recesses.

Furthermore, the exemplary embodiment shown in FIG. 7 differs from the exemplary embodiment shown in FIG. 6 in that the connection layer 4 and the molding layer 90 have anchoring structures 6 as shown in FIG. 5 and are thus anchored together both with regard to the vertical and with regard to the lateral direction.

Figure 8:
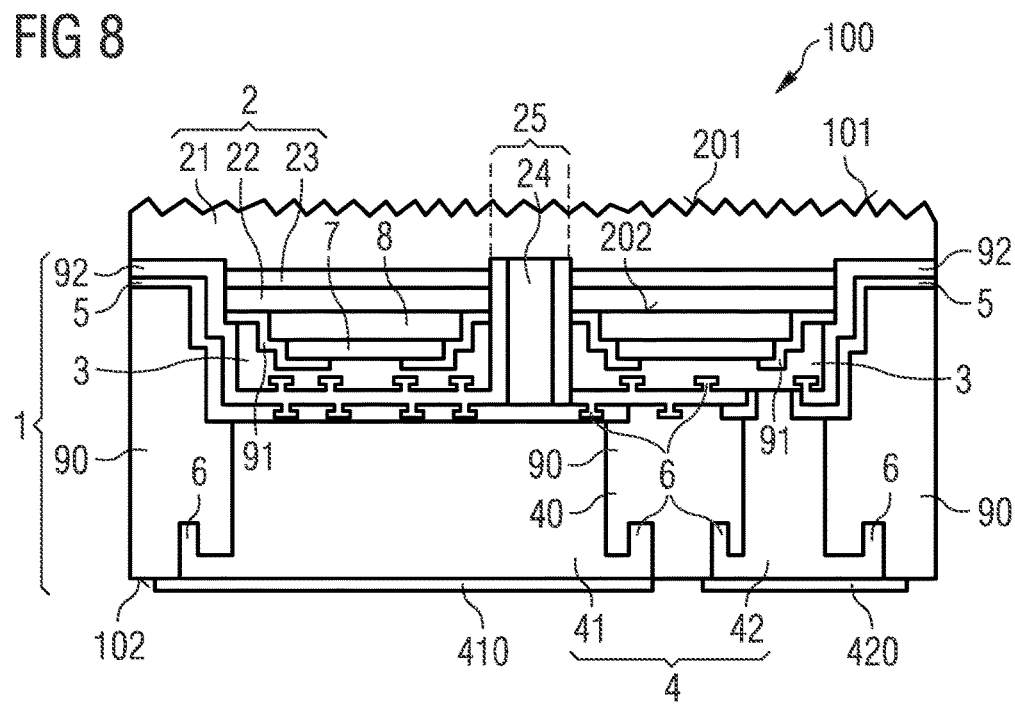

FIG. 8 shows a further exemplary embodiment of a device 100, wherein this exemplary embodiment corresponds substantially to the exemplary embodiment shown in FIG. 5. In contrast thereto, the passivation layer 92 comprises, as in FIG. 7, a plurality of differently oriented anchoring structures 6 in the form of projections, wherein by means of the differently oriented anchoring structures 6 the passivation layer 92 is anchored not only to the stabilizing layer 3 and to molding layer 90 but also to the mirror layer 5.

The device 100 with the semiconductor body 2 and the carrier 1, wherein the carrier 1 comprises a plurality of internal anchoring structures 6, may be produced using various methods. Preferably, the carrier 1 with the internal anchoring structures 6 is produced at least in part or completely using a 3D printing method. In particular, the metal layers 3, 4 and 5 and/or the insulation layers 92 and 93 and/or the molding layer 90 may be formed using the 3D printing method.

It is also possible for merely the connection layer 4 with the sub-regions 41 and 42 to be produced by a 3D printing method. The connection layer 4 may then be enclosed in a material, for example, a molding composition, for shaping the molding layer for instance by means of a molding or press-molding method. As a further alternative, the connection layer 4 and/or the stabilizing layer 3 with the anchoring structures 6 may be produced by a multistage method. In particular, the anchoring structures 6 may be produced by a multistage electroplating method. The molding layer 90 may then, for example, be applied to the connection layer 4 by means of a molding or a press-molding method.

Figure 9:
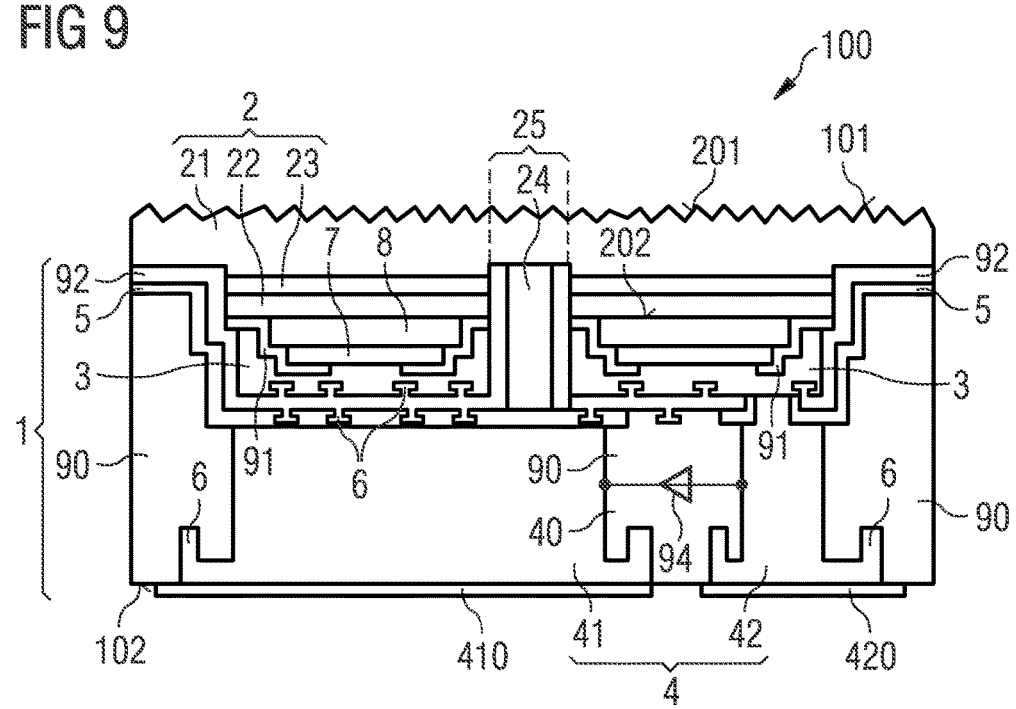

FIG. 9 shows a further exemplary embodiment of a device 100, wherein this exemplary embodiment corresponds substantially to the exemplary embodiment shown in FIG. 8. In contrast thereto, the carrier 1 comprises a protective element 94, which is configured in particular as a safety fuse. For example, the protective element 94 is a Schottky diode or a thyristor. The protective element 94 acts for instance as a safeguard against possible electrostatic discharges (ESD). The protective element 94 is arranged in the lateral direction between the first sub-region 41 and the second sub-region 42 of the connection layer 4, namely in the interspace 40. The protective element 94 is completely enclosed by the molding layer 90. In particular, the protective element 94 is electrically conductively connected with the semiconductor body 2, for instance by way of the sub-regions 41 and 42. The protective element 94 and the semiconductor body 2 may be interconnected in parallel, in particular anti-parallel. The protective element and/or the plurality of protective elements may in particular be produced by means of a 3D printing method for instance during formation of the sub-regions of the connection layer. In other words, the protective element 94 may be co-printed between the sub-regions 41 and 42 in the case of sufficient 3D printer resolution. The protective element 94 may thus be co-printed in the region of the interspace 40 using the 3D printing method. It is alternatively also possible to produce the protective element 94 separately and to introduce it into the carrier 1. The carrier 1 of the device 100 may also comprise a plurality of such protective elements 94. The carrier 1 shown in FIGS. 1 to 8 may likewise have one or a plurality of such protective elements 94.

The description of the invention made with reference to exemplary embodiments does not restrict the invention to these embodiments. Rather, the invention encompasses any novel feature and any combination of features, including in particular any combination of features in the claims, even if this feature or this combination is not itself explicitly indicated in the claims or exemplary embodiments.

The invention claimed is:

1. A device comprising:
 a carrier; and
 a semiconductor body arranged in a vertical direction on the carrier, the carrier comprising:
  at least one metal layer for electrically contacting the semiconductor body;
  a non-metallic molding layer;
  at least one electrically insulating insulation layer, wherein the insulation layer is arranged in the vertical direction between the semiconductor body and the molding layer; and
  internal anchoring structures, wherein at least two layers of the metal layer, the molding layer and the insulation layer are anchored to one another by the internal anchoring structures.

2. The device according to claim 1, wherein the at least two layers from the metal layer, the molding layer and the insulation layer are anchored together with regard to the vertical direction by the internal anchoring structures.

3. The device according to claim 1, wherein the at least two layers from the metal layer, the molding layer and the insulation layer are conformed to one another with regard to their local geometry at locations of the internal anchoring structures, and wherein the at least two layers form a form-locked connection at least in places.

4. The device according to claim 1, wherein each anchoring structure has a branched shape at one of its ends or has a cross-section which varies in the vertical direction or a lateral direction.

5. The device according to claim 1, wherein the anchoring structures are projections or recesses of the metal layer, the molding layer and/or the insulation layer, and wherein each anchoring structures has more than two prongs extending in different directions or an enlarged cross-section at one of its ends.

6. The device according to claim 1, wherein the insulation layer is arranged in the vertical direction between the semiconductor body and the molding layer, and wherein the insulation layer is anchored to the molding layer by the internal anchoring structures.

7. The device according to claim 1, wherein the metal layer is a connection layer having a first sub-region and a second sub-region spaced laterally from the first sub-region by an interspace, wherein the first sub-region is assigned to a first electrical polarity and the second sub-region is assigned to a second electrical polarity different from the first electrical polarity, and wherein the connection layer is anchored to the molding layer by the internal anchoring structures.

8. The device according to claim 7,
wherein the semiconductor body comprises a first semiconductor layer on a side remote from the carrier, a second semiconductor layer on a side facing the carrier and an active layer arranged between the first and second semiconductor layers, wherein the active layer is configured to generate electromagnetic radiation when the device is in operation,
wherein a through-via is formed at least in part in the semiconductor body, the through-via extending from the carrier through the second semiconductor layer and the active layer into the first semiconductor layer, wherein the first sub-region is electrically connected to the first semiconductor layer by way of the through-via, and
wherein the second sub-region is electrically connected to the second semiconductor layer.

9. The device according claim 7, further comprising a stabilizing layer of metal arranged between the semiconductor body and the connection layer, wherein the stabilizing layer laterally completely bridges the interspace between the sub-regions.

10. The device according to claim 1, wherein the carrier comprises at least two metal layers, wherein one of the at least two metal layers is a stabilizing layer arranged in the vertical direction between the semiconductor body and the molding layer, the stabilizing layer being anchored to the insulation layer by the internal anchoring structures.

11. The device according to claim 10, wherein the insulation layer is arranged in the vertical direction between the stabilizing layer and the molding layer and is anchored both to the stabilizing layer and to the molding layer by the internal anchoring structures.

12. The device according to claim 1, wherein the carrier comprises at least two metal layers, wherein one of the at least two metal layers is an electrically conductive mirror layer arranged in the vertical direction between the semiconductor body and the molding layer, and wherein the mirror layer is anchored to the insulation layer by the internal anchoring structures.

13. The device according to claim 1, wherein the device is a semiconductor chip, wherein the carrier forms a carrier of the semiconductor chip, and wherein the semiconductor body of the semiconductor chip directly adjoins the carrier.

14. The device according to claim 1, wherein the carrier comprises a protective element, and wherein the protective element is electrically conductively connected to the semiconductor body and serves as protection against electrostatic discharge.

15. A method for producing a device with a carrier and a semiconductor body arranged in a vertical direction on the carrier, the method comprising:
providing the semiconductor body; and
forming the carrier with at least one metal layer for electrically contacting the semiconductor body, a non-metallic molding layer, at least one electrically insulating insulation layer, and internal anchoring structures, wherein at least two layers from the metal layer, the molding layer and the insulation layer are anchored together by the internal anchoring structures, and wherein the carrier is produced on the semiconductor body by applying the carrier in layers to the semiconductor body.

16. The method according to claim 15, wherein different materials are applied laterally next to one another to produce the carrier with the internal anchoring structures, wherein metallic powders in form of micro- or nanoparticles are printed by a 3D printing method to produce the metal layer, and wherein polymers or ceramic powders are printed by the 3D printing method to produce the molding layer and/or the insulation layer.

17. The method according to claim 15, wherein the metal layer is a connection layer with a first sub-region and a second sub-region spaced laterally from the first sub-region by an interspace, and wherein the connection layer having the anchoring structures is formed by a 3D printing method and the molding layer is formed by a non-metallic material such that the molding layer adjoins the connection layer and is anchored to the connection layer by the anchoring structures.

18. The method according to claim 17, wherein a protective element is co-printed in the region of the interspace by the 3D printing method.

19. The method according to claim 15, wherein the metal layer comprises the anchoring structures and is surrounded at least in part by the molding layer, wherein the metal layer with the anchoring structures is produced by a multistage electroplating method and the molding layer is formed by a molding or press-molding method.

20. A device comprising:
a carrier; and
a semiconductor body arranged in a vertical direction on the carrier, the carrier comprising:
at least one metal layer for electrically contacting the semiconductor body;
a non-metallic molding layer;
at least one electrically insulating insulation layer, wherein the insulation layer is arranged in the vertical direction between the semiconductor body and the molding layer; and
internal anchoring structures, wherein at least two layers from the metal layer, the molding layer and the insulation layer are anchored to one another by the internal anchoring structures,
wherein the metal layer is a connection layer having a first sub-region and a second sub-region spaced laterally from the first sub-region by an interspace, wherein the first sub-region is assigned to a first electrical polarity and the second sub-region is assigned to a second electrical polarity different from the first electrical polarity,
wherein the connection layer is anchored to the molding layer by the internal anchoring structures,
wherein a stabilizing layer of metal is arranged between the semiconductor body and the connection layer, wherein the stabilizing layer laterally completely bridges the interspace between the sub-regions.

* * * * *